(12) United States Patent
Hajjar

(10) Patent No.: US 8,193,440 B1
(45) Date of Patent: Jun. 5, 2012

(54) HYBRID ELECTRIC GENERATOR

(76) Inventor: Hussein M. A. Hajjar, Jeddah (SA)

( * ) Notice: Subject to any disclaimer, the term of this patent is extended or adjusted under 35 U.S.C. 154(b) by 189 days.

(21) Appl. No.: 12/424,437

(22) Filed: Apr. 15, 2009

Related U.S. Application Data

(63) Continuation-in-part of application No. 12/199,549, filed on Aug. 27, 2008, now abandoned.

(51) Int. Cl.
*H01L 35/00* (2006.01)
*H01L 37/00* (2006.01)

(52) U.S. Cl. ......... 136/206; 136/214; 136/215; 136/200

(58) Field of Classification Search .................. 136/200, 136/205, 206, 214, 215, 221, 224, 225, 230, 136/233
See application file for complete search history.

(56) References Cited

U.S. PATENT DOCUMENTS

| | | | |
|---|---|---|---|
| 1,672,750 A | 6/1928 | Christiansen | |
| 1,673,429 A | 6/1928 | Vinson | |
| 2,126,656 A * | 8/1938 | Pack | 136/211 |
| 2,277,311 A | 3/1942 | Freeman | |
| 2,595,905 A * | 5/1952 | Telkes | 126/633 |
| 2,766,937 A * | 10/1956 | Snavely | 236/15 R |
| 3,496,028 A * | 2/1970 | Norton | 136/211 |
| 3,587,559 A | 6/1971 | Nonaka | |
| 3,929,121 A | 12/1975 | Rogers | |
| 4,137,899 A | 2/1979 | Weslow | |
| 4,587,810 A * | 5/1986 | Fletcher | 62/3.63 |
| 5,941,239 A | 8/1999 | Rogers | |
| 2005/0109386 A1 * | 5/2005 | Marshall | 136/253 |
| 2005/0263177 A1 * | 12/2005 | Bell | 136/224 |

FOREIGN PATENT DOCUMENTS

| | | |
|---|---|---|
| ES | 2288084 | 12/2007 |
| GR | 1005662 | 10/2007 |
| WO | WO2007139304 | 12/2007 |

* cited by examiner

*Primary Examiner* — Jennifer K. Michener
*Assistant Examiner* — Marla D McConnell
(74) *Attorney, Agent, or Firm* — Michael I. Kroll

(57) ABSTRACT

A device for producing energy and power utilizing incoming solar radiation to invoke a thermal differential inside the device to produce an electric current utilizing a phenomenon more commonly known as the Seebeck effect, which produces energy by heating the junction between two dissimilar metals to create an electric current stemming from both their other ends.

15 Claims, 11 Drawing Sheets

HYBRID ELECTRIC GENERATOR

RELATED APPLICATIONS

Figure 1:
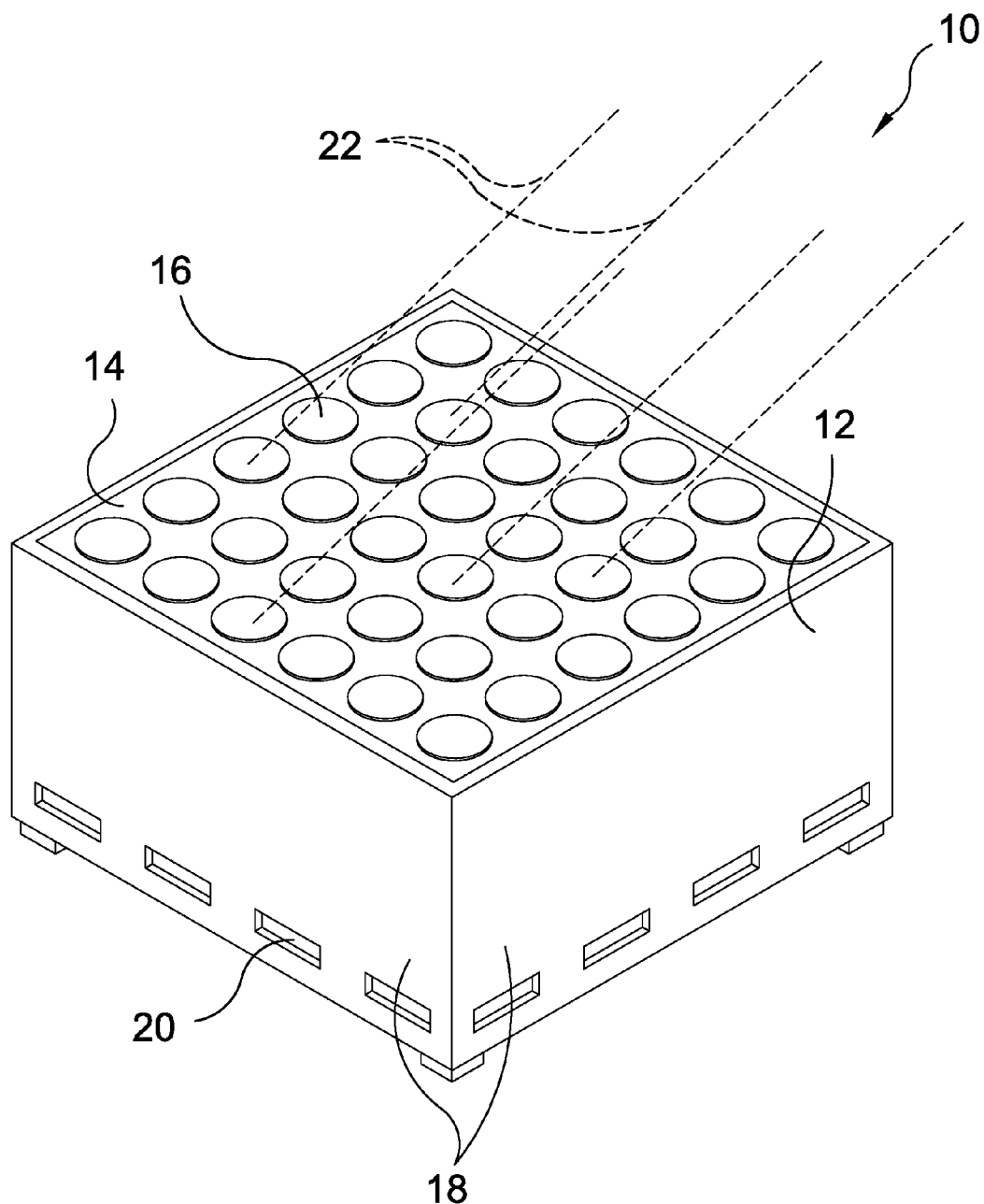

This is a continuation-in-part of U.S. patent application Ser. No. 12/199,549 filed 27 Aug. 2008 now abandoned, the contents of which are herein incorporated by reference.

BACKGROUND OF THE INVENTION

1. Field of the Invention

The present invention relates generally to generators and, more specifically, to a device for producing energy and power utilizing incoming solar radiation to invoke a thermal differential inside the device to produce an electric current utilizing a phenomenon more commonly known as the Seebek effect, which produces energy by heating the junction between two dissimilar metals to create an electric current stemming from both their other ends.

2. Description of the Prior Art

There are solar collection systems and devices. Typical of these is U.S. Pat. No. 1,672,750 issued to Christiansen on Sep. 21, 1927.

Another patent was issued to Vinson on Aug. 20, 1927 as U.S. Pat. No. 1,673,429. Yet another U.S. Pat. No. 2,277,311 was issued to Freeman on May 24, 1940 and still yet another was issued on Jun. 28, 1971 to Kenshichi as U.S. Pat. No. 3,587,559. Another patent was issued to Rodgers on Dec. 30, 1975 as U.S. Pat. No. 3,929,121.

Yet another U.S. Pat. No. 4,137,899 was issued to Weslow on Feb. 6, 1979. Another was issued to Rogers on Aug. 24, 1999 as U.S. Pat. No. 5,941,239. Another patent was issued to Drongitis on Oct. 2, 2007 as Greece Patent No. GR1005662 and still another International Patent Application Publication was published on Dec. 6, 2007 to Park as WO2007/139304. Another patent was issued as Spain Patent No. ES288084 on Dec. 16, 2007.

This invention relates to heaters, an object being to provide means for utilizing the heat of the sun rays for heating water. Another object of the invention is the provision of a heater of this character which is constructed of sections arranged so that one or more sections will be positioned transversely of the direct rays of the sun as the latter travels across the horizon, together with means for directing the sun's heat upon a receptacle or container for water or other liquid and to provide a circulation through the receptacle.

This invention relates to sun ray solar heaters and more particularly to a stationary form of this device employed in heating water. An important object of the invention is to improve the structure of the heater as usually manufactured to render the same more efficient and rapid in its action. A further object of the invention is to provide a device of this character which may be readily and cheaply produced and which will be durable and efficient in service.

The present invention relates to improvements in sun water heaters, and more particularly relates to a domestic or other hot water storage system in which the heat rays of the sun are utilized in a novel form of heater to raise the temperature of the water to that high degree necessary for use in a system of this character. A primary object of the invention is to utilize a lens construction which will pick up the sun's rays from various angles and concentrate and intensify the heat effect of the sun's rays by directing such rays upon a confined area for application to the water undergoing heat treatment to the end that the natural heat energy of the sun as applied to the heater will be multiplied by concentration of rays in a manner to establish high efficiency in the heater with comparatively small exposure area and comparatively small water capacity in the heater per se to nevertheless supply relatively large quantities of water to a relatively large storage tank whereby hot water in ample quantities will always be available for any household or other uses.

An apparatus for heating water by solar rays in which a plurality of spherical lenses are used to enable solar rays to be converged whenever there is sunlight present. Also incorporating a superheat resisting carbon impregnated cloth to cover that area of metal which is subjected to the intensive heat of the focused rays.

A solar heat collector positions a flat lens panel in spaced relation to a collector panel having a plurality of interconnected heat collector elements through which a fluid medium to be heated is circulated. Individual lenses in the panel focus on the individual heat collector elements and dark colored heat collecting partitions therein. Flat Fresnel's lenses formed in accordance with Fresnel's reflection formula in inexpensive, transparent, synthetic resin material are preferred.

A plural stage solar radiation fluid heater comprises a housing having a top in which there is an array of lenses. Near the inside bottom of the housing, there is a first fluid conduit located at the foci of the lenses for absorbing primary solar radiation focused thereon. One or more additional conduits are interposed between the first conduit means and the lenses and are arranged to permit passage of the ray bundles from the lenses to the first conduit means. The arrangement is such that the intervening circuit means intercept secondary terminal radiation which is re-radiated from the next adjacent hotter conduit means.

A multiple lens solar heating unit consisting of a piping component, a housing component with a transparent housing cap, holes within the housing component for entry and exit of the piping component, multiple lens mounting braces affixed parallel wise to inner walling of the housing component, a plurality of external lens holders mounted to the braces by mounting pins and rotatably pivotable in an XY plane, an equivalent plurality of internal lens holders mounted one each to each external lens holder by mounting pins and rotatably pivotable in an XZ plane and an equivalent plurality of magnifying lens mounted one each within each internal lens holder.

The lenses at the face of the solar collector are set to concentrate solar radiation on the heaters into the heat insulated pipe via the heating means. Therefore, the energy is collected, conveyed and utilized through lens, heaters & heating means. The sun-oriented lenses use an electronically monitored movement system. The intensity of the solar radiation as well as the temperature and pressure of the heating means are coordinated via the sensors, and the electronic circuit provided. In case that the pressure or the temperature of the heating means overpasses the safety limits, the movement system moves the lenses away from the sun. If the analogy between solar radiation and temperature of means is not satisfactory, special sprayers automatically cleanse the external face of the lenses. If same analogy keeps being unsatisfactory, the user is warned, via the electronic circuit, by indication appeared on the control panel.

A heating system using solar heat is provided, which includes: a unit housing in which an air heating chamber is formed; an air inflow unit which is provided in one side of the unit housing to make outer air flow into the air heating chamber; a discharge unit which is provided at the other side of the unit housing and discharges air heated in the air heating chamber; a plurality of convex lenses which are provided on one surface of the unit housing to collect solar light; and a heating plate which is provided in the air heating chamber of the unit housing and is arranged at a location where a focus of solar light is set by the convex lenses, and is heated by the solar heat collected by the convex lenses to thus heat the air in the air heating chamber. The heating system using solar heat can improve heating and warm water efficiency even with a simple structure in comparison with the conventional art, and can remarkably lower a manufacturing cost and a maintenance cost enough to thereby commercialize and use it widely without restriction in place and usage.

The method involves reflecting the solar light on the solar plates, which place an array of magnifying glasses to increase the heat. The array of glasses receives the solar light and reflects to the magnifying glasses to increase the heat on the solar photovoltaic plate.

While these devices may be suitable for the purposes for which they were designed, they would not be as suitable for the purposes of the present invention, as hereinafter described.

SUMMARY OF THE PRESENT INVENTION

Though using solar cells modules to generate electricity is becoming very common these days, they are limited to the visible light portion of the electromagnetic spectrum, but as we know there is another portion, namely the infrared radiation, which contrary to visible light can be stored as heat energy and be used whenever needed. So if the infrared radiation is stored during the day light hours while the solar cells are active, this heat energy can keep our power supply running after sunset till next morning.

By combining an infrared radiation module and a solar cell module produces a continuous power supply that doesn't need any expensive batteries or back up systems, thus making this fine highly advanced cell affordable to vast number of users.

General Description:—

The hybrid solar generator consists of two generators:—
1—The solar cells module.
2—The thermo electric tile module disclosed in patent application Ser. No. 12/199,549, but specially modified to have two working Phases:
1—Work as a thermal energy collecting and storing device during the day light hours as long as the solar cells module is active, and will be called (THE COLLECTING PHASE).
2—Work as a power generator when the cells became inactive after sunset or cloudy days, and will be called (THE GENERATING PHASE).

This design will be called ((The Thermo Generator Module)).

The two modules will be connected together and will be controlled and operated by a Micro Processing Unit ((M.P.U.)), this MPU is sensitive to the solar cells module power production level, and controls the thermo generator module phases according to that level, if this level is at the max, the thermo module phase will be the collecting phase, when the production level starts to decline and the cells became unable to produce, the MPU will change the phase of the thermo module to the generating phase, and by this the system will keep running. The MPU will be powered by a chargeable dry cell, which can be charged from the system.

The Thermo Generator Module:—

It is in general a flat plate controller designed to collect and store the sun thermal energy to be used to generate an electrical current, using a scientific phenomenon known as SEEBECK EFFECT, which is:—When two dissimilar metals, such as iron and copper, are joined together at one end and the junction heated a current is set up between the other two ends.

There are two factors that affect the magnitude of the electrical current:—
1—The degree of temperature, which will be applied on the hot end with higher temperatures producing higher current.
2—The kind of metals used, but here I am not trying to study this subject, there are many specialized companies that produce these junctions bimetallic or semiconductor junctions.

By collecting the solar thermal heat by the thermo generator module and then expose these junctions to this heat, we can have a reliable and practical source of energy which can be used in endless applications.

The Design Purpose:—

The idea is to make a complementary device for the solar cells modules in order to overcome their shortcoming, which is their disability of being full time power generators, and to eliminate their need of bulky and expensive batteries and back up systems. Though these thermo modules can be used as stand alone electrical generators for a lot of applications.

The Advantages of the Design:—
1—It is capable of accepting the direct radiation coming from the sun and the diffused radiation reflected by clouds and other objects.
2—Its ability to store a huge amount of heat energy at high temperatures.
3—No sun tracking device because its transparent cover by its unique design can hunt the solar rays all day without moving the module.
4—Extends electrical power generation through a hybrid system comprising a solar cell module and thermal mass module thereby extending the daily use past sunset.
5. Generating power can be stop at any time when there is a need for it, and save the heat energy inside the module until it is needed again, simply by pulling the thermal generator circuit out of the heat sink (putting the module generating phase on), unlike other generators such as wind or solar cell generators, which have to have bulky batteries to store the energy.

The Thermo Generator Module General Description:—

The thermo generator module consisted of the following parts:—
1—The transparent cover:—Collects, concentrates and aims the suns radiation to the inside of the module.
2—Receiver, Conductor and Heat sink system:—Receives the collected radiation from the transparent cover and then conducts it to the thermal mass, then works as a heat sink radiator.
3—The insulated material.
4—The thermal mass:—The material which receives the heat from the receiver plate. This mass will act as a:
  a—Thermal storage tank.
  b—Thermal source or feeder
5—Thermal Generator Circuit:—Generates the electrical power when exposed to the thermal mass heat.
6—Linear Electrical Actuator Slides:—Pushes or pulls the thermal generator circuit in and out the heat sink.
7—The Container:—Contains, holds and protects the inner parts of the thermo generator module.

The Detailed Description:—
1—The Transparent Cover:—

It is the outer top surface of the collector preferably made of glass because whenever solar energy hits a sheet of glass at right angles, as much as 90% of it is directly transmitted through the glass, the reason for this high efficiency is that the wavelength range of incoming solar energy is mostly (98%)

less than 3 micro meter, and the transmittance of glass is very good for wavelengths under 3 micro meter.

This sheet of glass is either a flat sheet or slightly concave like an arch (in order to make the direct radiation fall on the glass sheet parallel to the lenses axis), the surface of this sheet is covered by rows of small (FRESNEL LENSES)**, separated by rows of plane surfaces in a succession, the width of the plane surface rows is equal to the diameter of the Fresnel lenses. The purpose of this design is to hunt both kinds of solar radiation because:—
1—The plane surface rows will collect the diffused radiation.
2—Fresnel lenses rows will collect the direct radiation.

Therefore, if we make the whole sheet like that and if we installed it in the proper direction with the suitable incline, we can collect the max. heat energy from the sun all day long from dawn to dusk.

The focal length of the lenses must be in the range of more than (2 cm), because by this length we can have an air gap between the transparent cover and the receiving plate to work as a thermal insulator.

**Fresnel Lenses are usually thin and flexible lenses, is about 0.015 inch (0.38 mm) thick, with grooves molded into one surface. The groove side of the lenses usually faces the receiving plate. These Fresnel lenses both captures more infra red radiation, and focuses it to a small point, these focal points move across the receiving plate as the IR source moves, this means the IR radiation will reach every point on the receiving plate surface, this will increase the efficiency of transferring and distributing the heat energy to and inside the thermal mass.

2—The Receiving, Conducting and Heat Sink System:—

A metallic box, hereinafter referred to as the HOT BOX, made of a good conducting metal such as copper, which is the preferable metal because the copper thermal conductivity is high, (=400 approx), this helps in gaining and conducting heat to the thermal mass—, its lower side had been transformed to form the HEAT SINK.

The whole inside surface of this hot box must be covered by a thermal grease, also known as transistor heat sink compound, which is a grease like material used to enhance heat transfer between two surfaces, the inside of the metallic box and the thermal mass. The cavity inside this box is full of the thermal mass material.

It consists of the following parts:—
a—The Upper Plate:—

A solid metallic sheet is located under the transparent cover, facing the cover inner side, the distance between them is equal to the focal length of the lenses. This plate receives the collected IR radiation and conducts it through the vertical meshed sheets to be stored in the thermal mass. Its upper side, which faces the transparent cover, must be painted with a heat resistant black paint in order to increase its heat absorption capability and minimize heat reflection.

b—Vertical Meshed Sheets or Fins:—

Made of the same metal as the rest of the hot box, these sheets connect the upper plate with the lower plate from inside the box and stand vertically between them. Their connecting area with the lower plate will be at the top of each peak of the wave like shape forming the heat sink, their work is to carry the heat from the upper plate and distribute it into the thermal mass inside the hot box, and the goal of making them mesh and not solid is to keep the thermal mass as a whole, not isolated pieces, and at the same time in contact with the receiving plate in as many points as possible so the heat will reach every part of this mass. The surface area of these sheets must be as large as possible because the heat transfer rate is proportion to the surface area.

c—The Lower Plate (the Bottom of the Hot Box)

A solid metallic sheet forming the bottom of the metallic box, this sheet has the shape of a rectangular wave having right angles and flat peaks, these peaks are welded to the vertical mesh sheets on their inner flat tops inside the metallic box forming the heat sink fins by the right angle (standing) sides outside the hot box.

The heat sink fins will conduct the heat energy from the thermal mass inside the hot box, and radiate it to the thermo generators, when the power-generating phase is on, the thermo circuit slides inside and is engulfed by the heat sink sides.

The flat horizontal parts of this lower plate, from the out side of the hot box (the out side surface of the box bottom) must be isolated.

This insulation has two parts:—
a—Fixed insulated strips or pieces, covering the lower outer horizontal parts of the bottom.
b—Movable horizontal strips, located in between each two vertical sides of the heat sink, inside the space between them, these strips can be pushed up or pulled down to open or close the heat sink gaps.

3—The Insulation Material Design

The only part of the module, which must be isolated is the hot box. This material must—
a—Have a very high insulating factor; and
b—must be or can be formed as rigid sheets, in order not to be bulky.

The hot box will be isolated from its four vertical sides and its bottom, the four sides isolation will be fixed sheets covering the sides completely, the outer surface of the lower plate (the bottom plate) isolation consisted of two parts:—
a—Fixed isolated stripes covering the horizontal flat parts of the bottom, these stripes must be wide enough at the opening sides of the heat sink part to form edges, these edges have two acts:—
  1—Keep the movable stripes inside the heat sink gaps and prevent them from falling out of these gaps.
  2—Strengthen the sealing and the insolating effect of these movable parts and prevent heat leaking.
b—Movable stripes, located horizontally inside each cavity formed by every two successive vertical sides of the heat sink fins, these stripes can be pushed up to let the thermal circuit peaks be slid in between the heat sink fins, or be pulled down to seal the gaps openings, after the thermal circuit comes out of these gaps, together with two stripes, can provide a sufficient and complete isolation for the outer lower face of the hot box bottom.

4—The Thermal Mass:—

The material fell the inner cavity of the hot box. This material absorb the heat from the receiving plate and mesh sheets and store it to be used later, it is the heat reservoir of the module which will feed the thermal circuit by its need of the heat energy to keep it working sufficiently.

The surface contact between the thermal mass and the hot box must be as firm as possible, in order to enhance the heat transfer between them, a thermal grease material can be used for this purpose. The specification of the ideal thermal mass are:—
a—High specific heat.
b—High density.
c—Low thermal conductivity (but not extremely low), since the gained thermal heat energy is the quantity of the heat energy, which can be stored in a specific material.

Ceramics, can be considered as the best materials for this purpose, such as crushed fine granulates of the red bricks, and that because its thermal specifications are:—
a—Its specific heat=0.84 jc/g
b—Its density=1925 kg/m2
c—Its thermal conductivity=0.72 w/mk Red bricks are reasonably cheap material, and available almost every where.

5—The Thermal Generators Circuit:—

It is the part of the module, which generates the electrical current, using Seebeck Effect. It consists of a series of thermo electric couples, built in a specially designed carrying board, these couples are connected together in a series to form an electric circuit.

The thermal generator circuit consists of the following parts:—
a—An electronic component carrying board.
b—Thermo electric couples.
c—Insulating material.
d—Carrying rods.

The detailed description of these parts:— a—Carrying board has the shape of rectangular wave having right angles vertical sides and flat horizontal peaks, at its upper face which is facing the bottom of the hot box, the same as the lower plate of the hot box, but with smaller dimensions, its width must be small enough to enable the circuit to be slid in and out the gaps of the heat sink, its height must be short enough to be engulfed completely by the heat sink fins, when it slid in, the lower face of this carrying board is flat and covered completely by an isolating sheet.

b—The Thermo Electric Couples:—

They consisted in their simplest shape of two dissimilar metals joined together at one end to form a junction, while the dissimilar metals joined together at one end to form a junction, while the other ends are free. Very advanced couples are available nowadays made of semiconductor materials, and there are many pioneering companies producing them.

These couples must be implanted in the carrying board at the top of the flat peaks of this board, in a way that, their junctions (the ends which must be heated) are the peaks of the upper face of the carrying board, so when the board is pushed inside the heat sink gaps, these junctions will be surrounded by the heat sink vertical fins, and will be exposed to the heat radiated by these fins.

The other ends of the thermo electric couples (the ends that must be cold) will come out of the lower face of the carrying board passing through the isolation sheet, where they connected together in series.

c—The Insolating Material:—

The only part that needs to be isolated is the lower flat face of the circuit carrying board, because the hot box has its own insulation, and as long as the collecting phase of the module is on, and the thermal generator board peaks are out of the heat sink cavities, no heat will leak, but when the generating phase is turned on and the circuit peaks have been pushed and slide in between the heat sink fins, the heat will start to leak, this has two undesirable effects:—
1—Wasting valuable heat.
2—Raising the temperature of the thermo couples cold ends area, causing a reduction in the power generation, so by isolating the lower flat face of the circuit, whenever the circuit slides inside the heat sink, this insulation will seal the system thermally, keeping the heat inside, where it is needed and the cold ends unexposed to its effect.

d—Carrying Rods:—

They are hard solid rods fixed on top of the flat peaks of the thermal generator's circuit in order to carry the movable insolating stripes, though these stripes are located inside the heat sink cavities, between the fins, but they are considered part of the thermal circuit, because they are connected together by these carrying rods. During the generating phase, they will push the stripes all the way up inside the cavities. While during the collecting phase, the stripes will be pulled down by these rods in order to seal the gaps to prevent heat leakage. The rods number and distribution on the circuit peaks depend on the size of the circuit.

6. The Linear Electrical Actuators or Slides:—

They are the tools, which will be used to push or pull the thermal circuit into or out of the heat sink cavities.

These tools will be fixed vertically on top of the bottom, inside the container, and will carry the thermal circuit on the tips of their shafts, an adequate number of them are needed, depending on the weight and size of the thermal circuit.

They will be powered and controlled by the micro processing unit to extend or retract the thermal circuit according to the required phase whether it is a generating or collecting one.

7—The Container:—

It is the box or the shell, which contains all the other components of the collector inside.

Its main purposes are—
a—To protect these components form the weather and any other damaging factors.
b—To secure them in their places and positions accordingly, so they can perform correctly.

It is consisted of (4) sides and a bottom, where is the top side will be open to fix the transparent cover. The (4) sides have horizontal edges to carry the metallic hot box, and keep it secure in its place.

The distance between the transparent cover and these edges must equal to the height of the hot box plus the focal length of the lenses, so the upper receiving plate will be in the focal range of these lenses.

The distance between these edges and the bottom plate of the container equal to the height of the thermal circuit, measured from its peaks to its bottom, plus the height of the linear tools (while their shafts are un extended).

Below these carrying edges, the sides of the container must be full of gaps or holes, to work as ventilators, to let the air to flow through the container, in order to keep the temperature as low as possible under the thermal circuit, where the cold ends of the thermal generators location is.

The bottom of the container is a flat plate standing on suitable legs, it has gaps or holes for ventilation reason also.

On this bottom inside the container, the linear tools will be fixed firmly, carrying the thermal circuit.

The container must be treated to stand up the hottest driest, and wettest conditions, so it must be robust and well protected by paint etc. it must also provide suitable anchorage points for securing the module in its place.

Operating the Module for the 1$^{st}$ Time:—

After assembling the Hybrid system correctly, in a good ventilated, un-shaded place, we must be sure that the thermal generators module is on the collecting phase, that is all the linear tools shafts are descended and the thermal circuit peaks have been pushed outside the heat sink cavities.

As soon as the sun shines, the solar cells module will come to live and start producing the electrical power. A negligible quantity of it will be used to charge the M.P.U. batteries, then it will take control and keep the system running accordingly.

A primary object of the present invention is to provide a hybrid electric generator using sun light and infrared radiation to produce electricity.

Another object of the present invention is to provide a hybrid electric generator comprising a solar cells unit and a thermal radiation unit.

Yet another object of the present invention is to provide a hybrid electric generator that is not completely dependant on sun light to generate electricity.

Still yet another object of the present invention is to provide a hybrid electric generator that doesn't require sun tracking device or batteries to store generated electricity.

Additional objects of the present invention will appear as the description proceeds.

The present invention overcomes the shortcomings of the prior art by providing a device for producing energy and power utilizing incoming solar radiation to invoke a thermal differential inside the device to produce an electric current utilizing a phenomenon more commonly known as the Seebek effect, which produces energy by heating the junction between two dissimilar metals to create an electric current stemming from both their other ends.

The foregoing and other objects and advantages will appear from the description to follow. In the description reference is made to the accompanying drawings, which forms a part hereof, and in which is shown by way of illustration specific embodiments in which the invention may be practiced. These embodiments will be described in sufficient detail to enable those skilled in the art to practice the invention, and it is to be understood that other embodiments may be utilized and that structural changes may be made without departing from the scope of the invention. In the accompanying drawings, like reference characters designate the same or similar parts throughout the several views.

The following detailed description is, therefore, not to be taken in a limiting sense, and the scope of the present invention is best defined by the appended claims.

DESCRIPTION OF THE REFERENCED NUMERALS

Turning now descriptively to the drawings, in which similar reference characters denote similar elements throughout the several views, the figures illustrate the Hybrid Electric Generator of the present invention. With regard to the reference numerals used, the following numbering is used throughout the various drawing figures.

- 10 Hybrid Electric Generator of the present invention
- 12 housing hot box
- 14 thermal collector
- 16 Fresnel lens
- 18 side plate of 12
- 20 vent
- 22 heat
- 24 electrical current
- 26 first metal element
- 28 second metal element
- 30 plano convex lens
- 32 collecting plate
- 34 photonic radiation
- 36 focal length
- 38 lower plate
- 40 mesh sheet
- 42 movable isolation strip
- 44 fixed strips
- 46 carrying rod
- 48 linear activator
- 50 thermal mass cavity
- 52 carrying board
- 54 photovoltaic panels
- 56 microprocessor unit
- 58 dry cell storage
- 60 base plate of 12
- 62 ventilation gaps
- 64 hot box carrying edge

BRIEF DESCRIPTION OF THE DRAWING FIGURES

Figure 2:
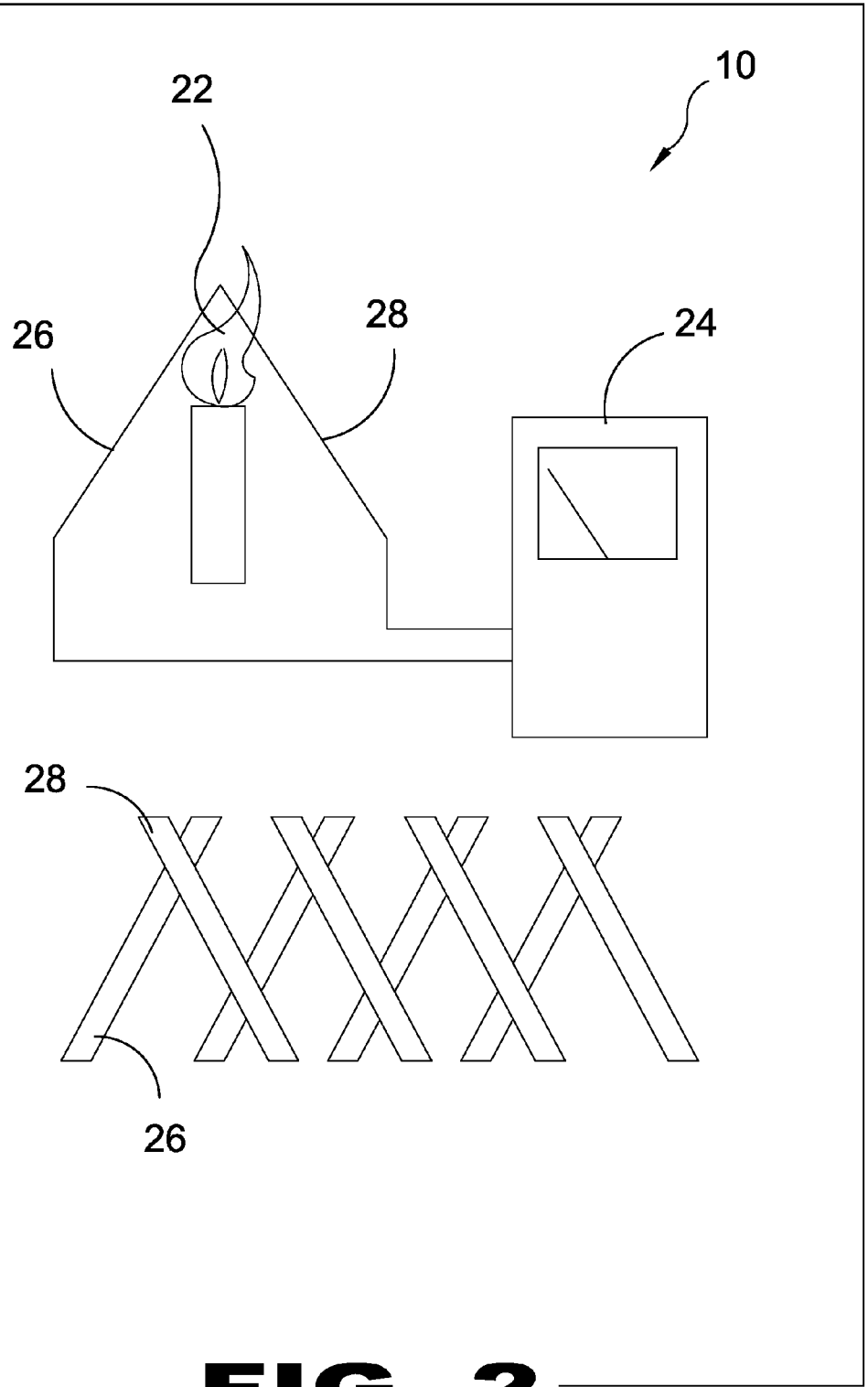
Figure 3:
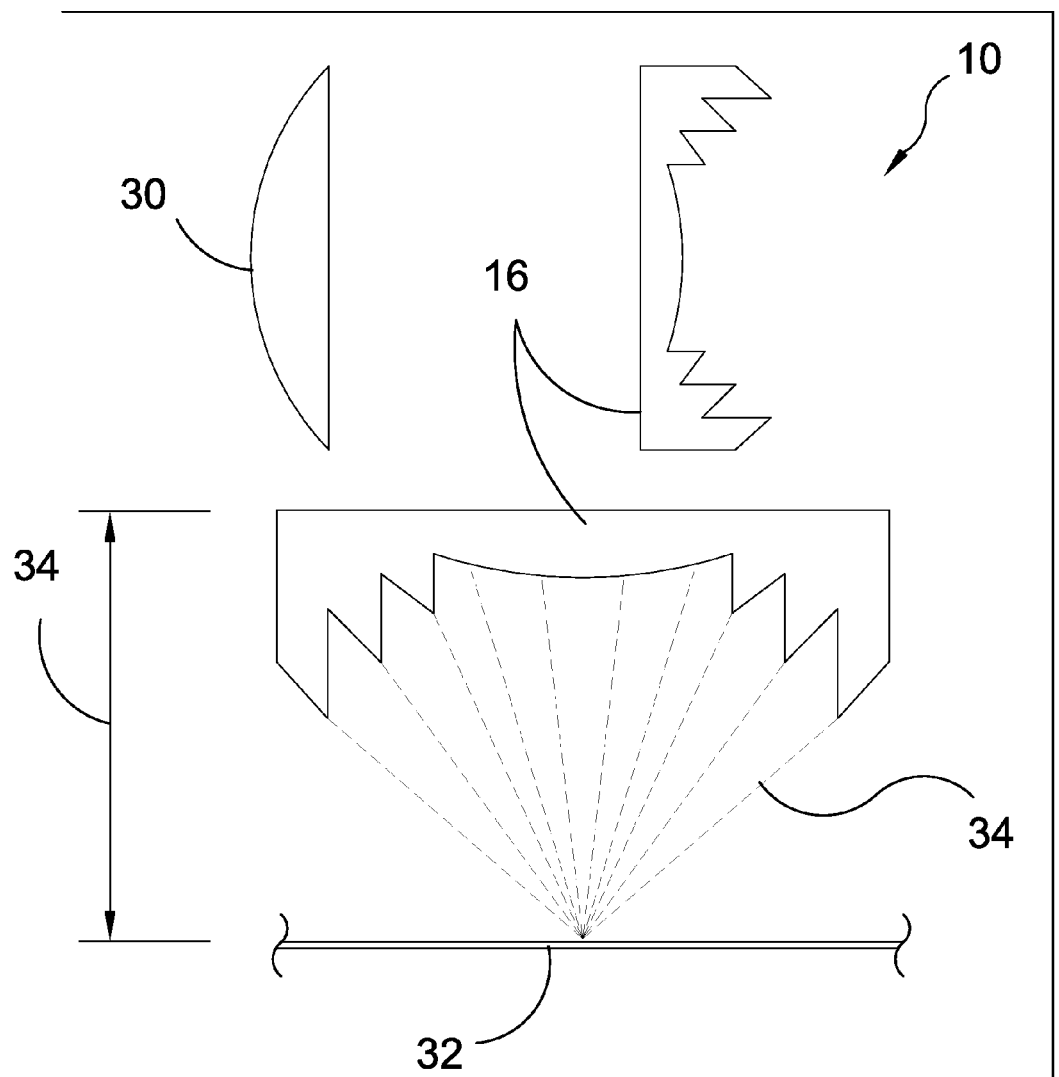
Figure 4:
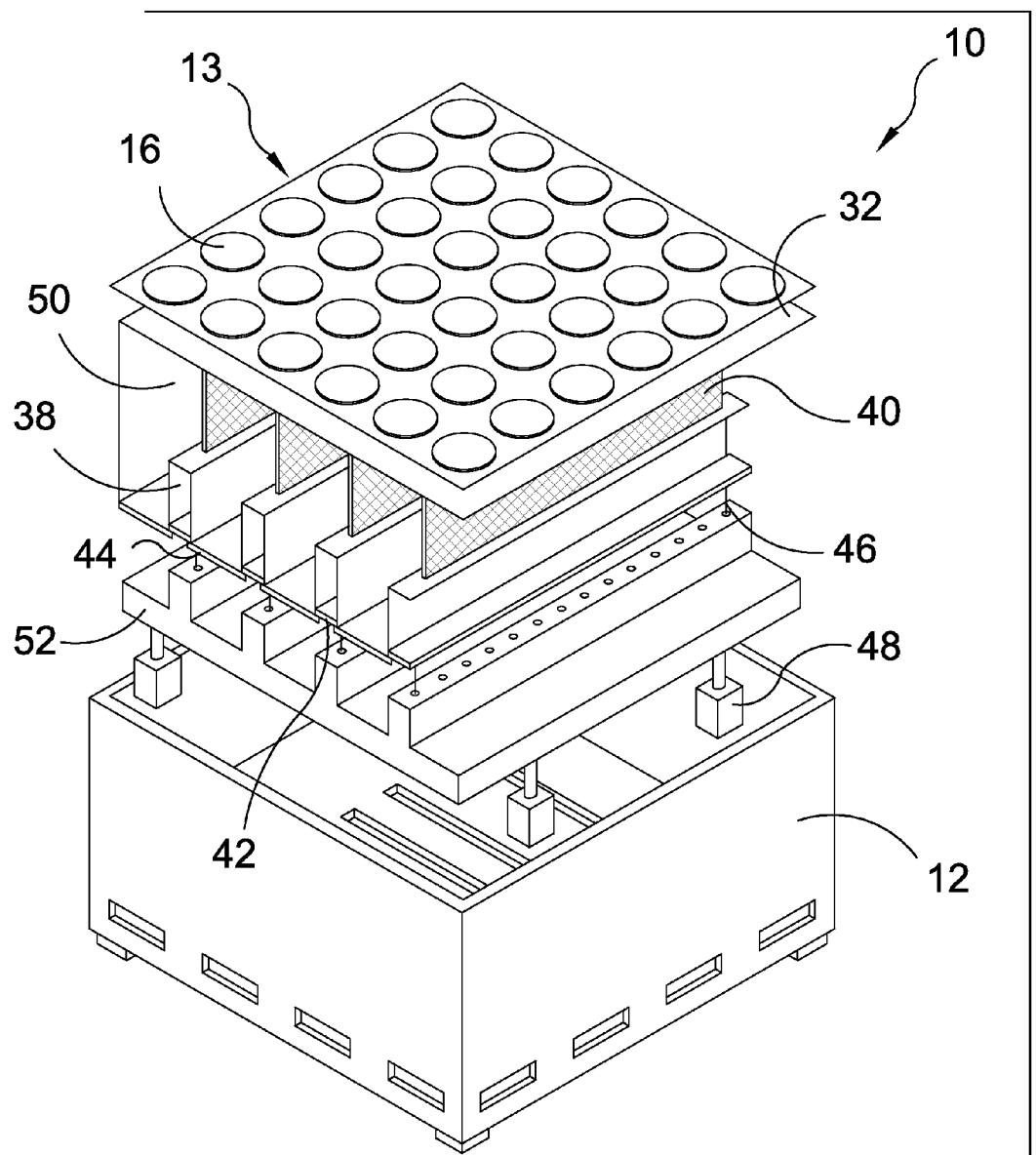
Figure 5:
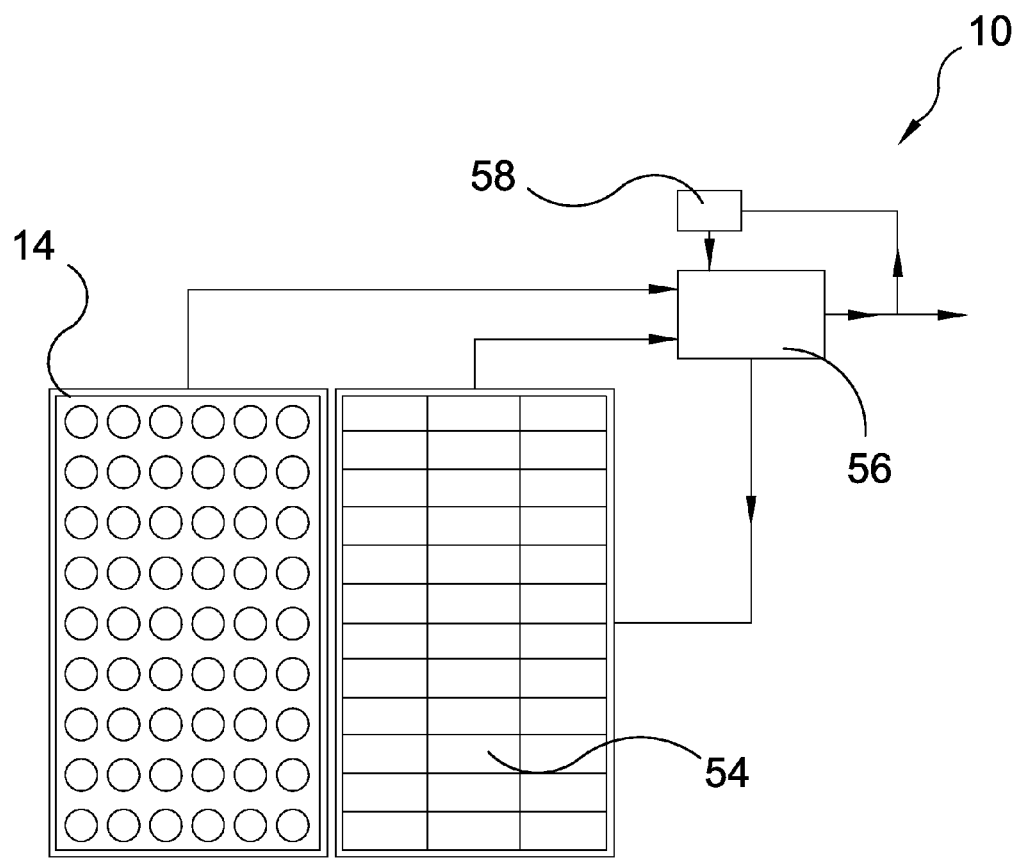
Figure 6:
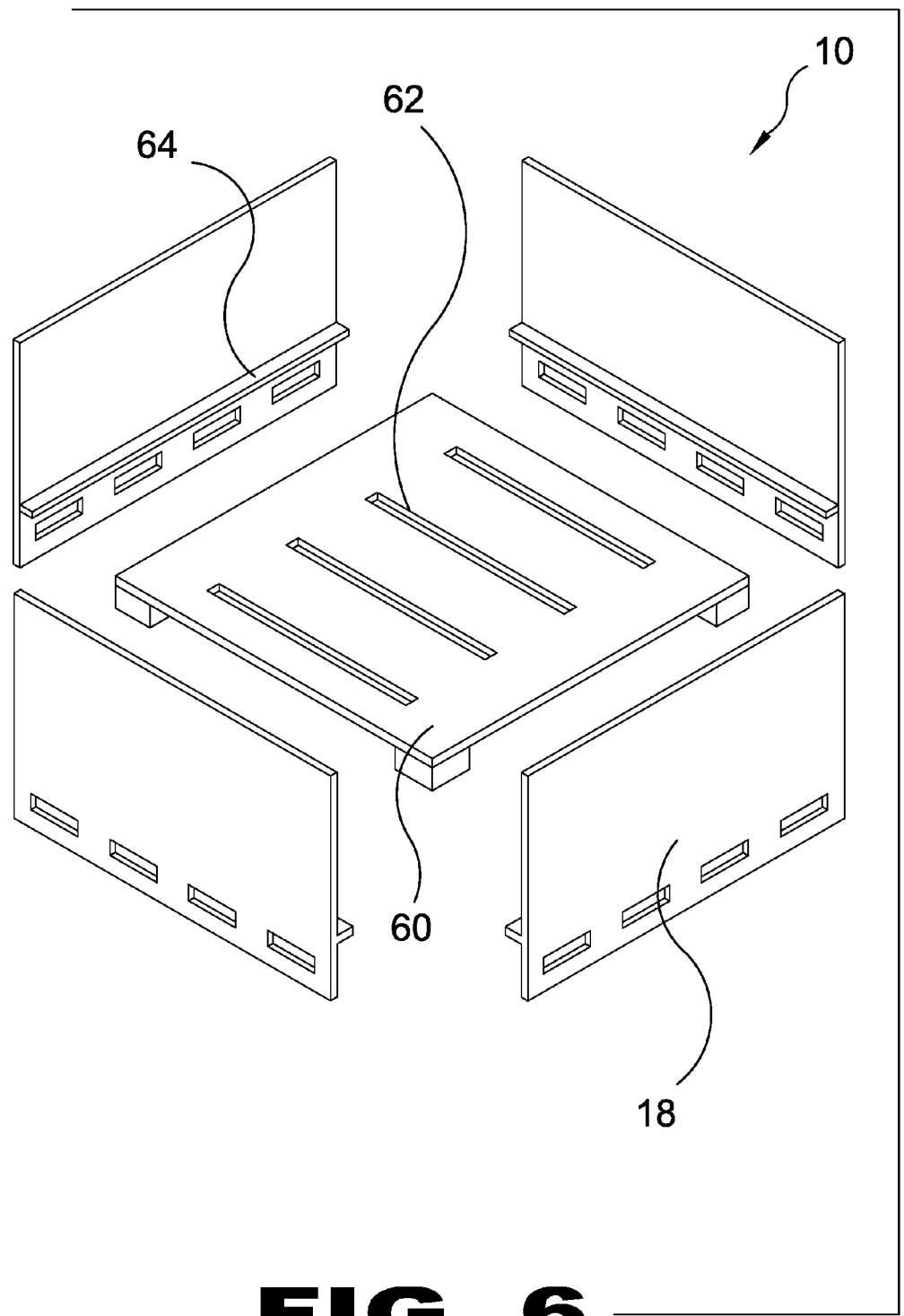
Figure 7:
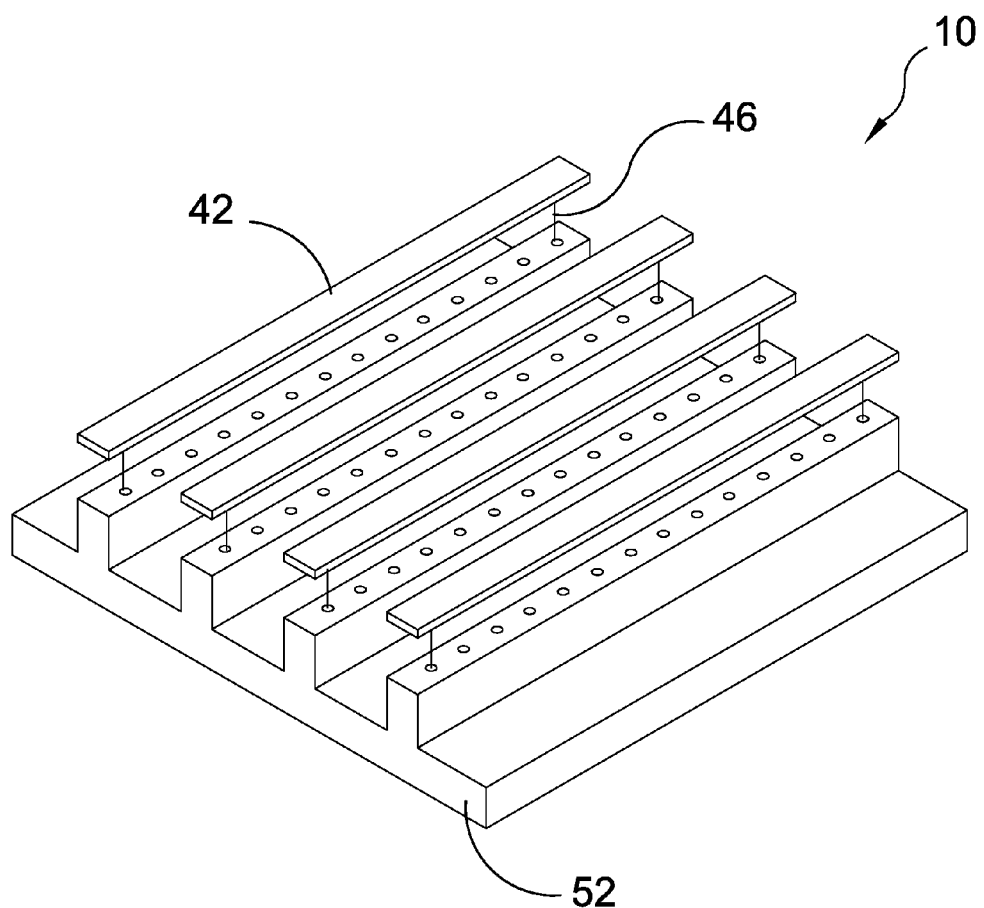
Figure 8:
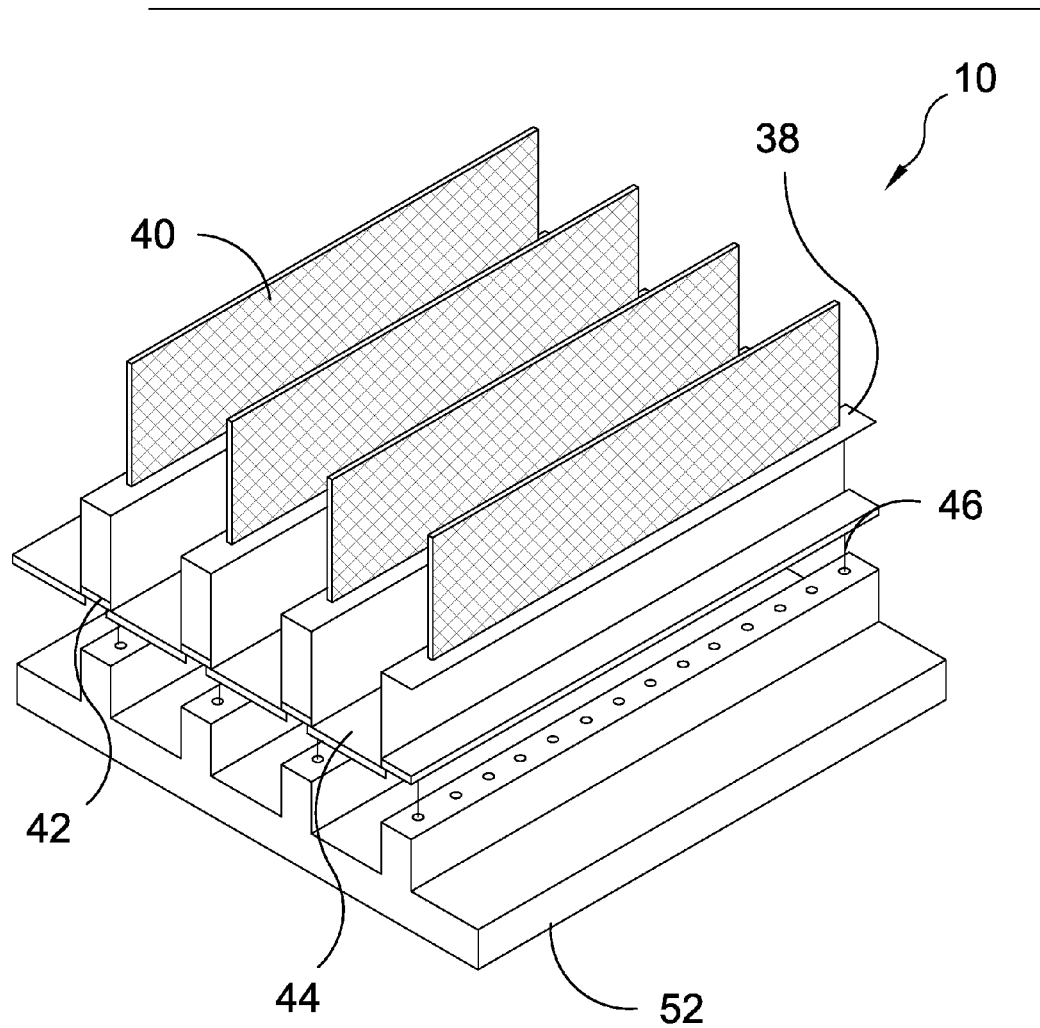
Figure 9:
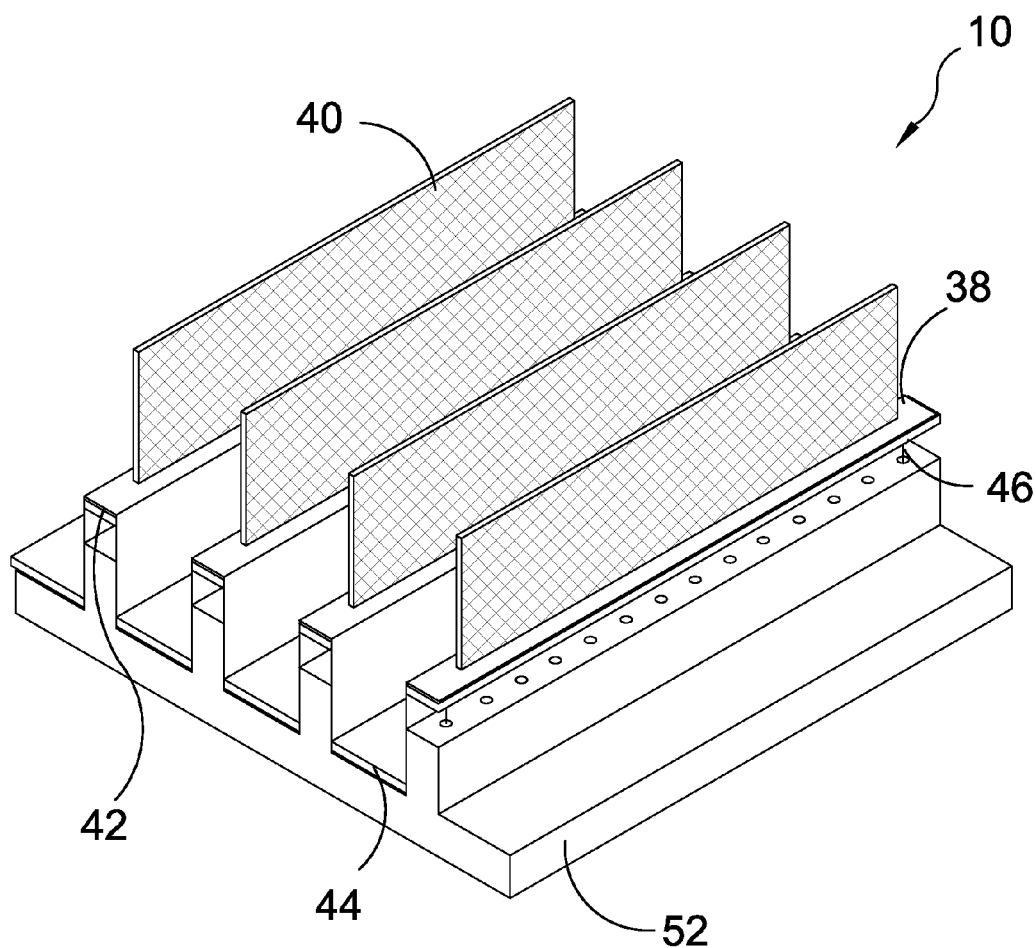
Figure 10:
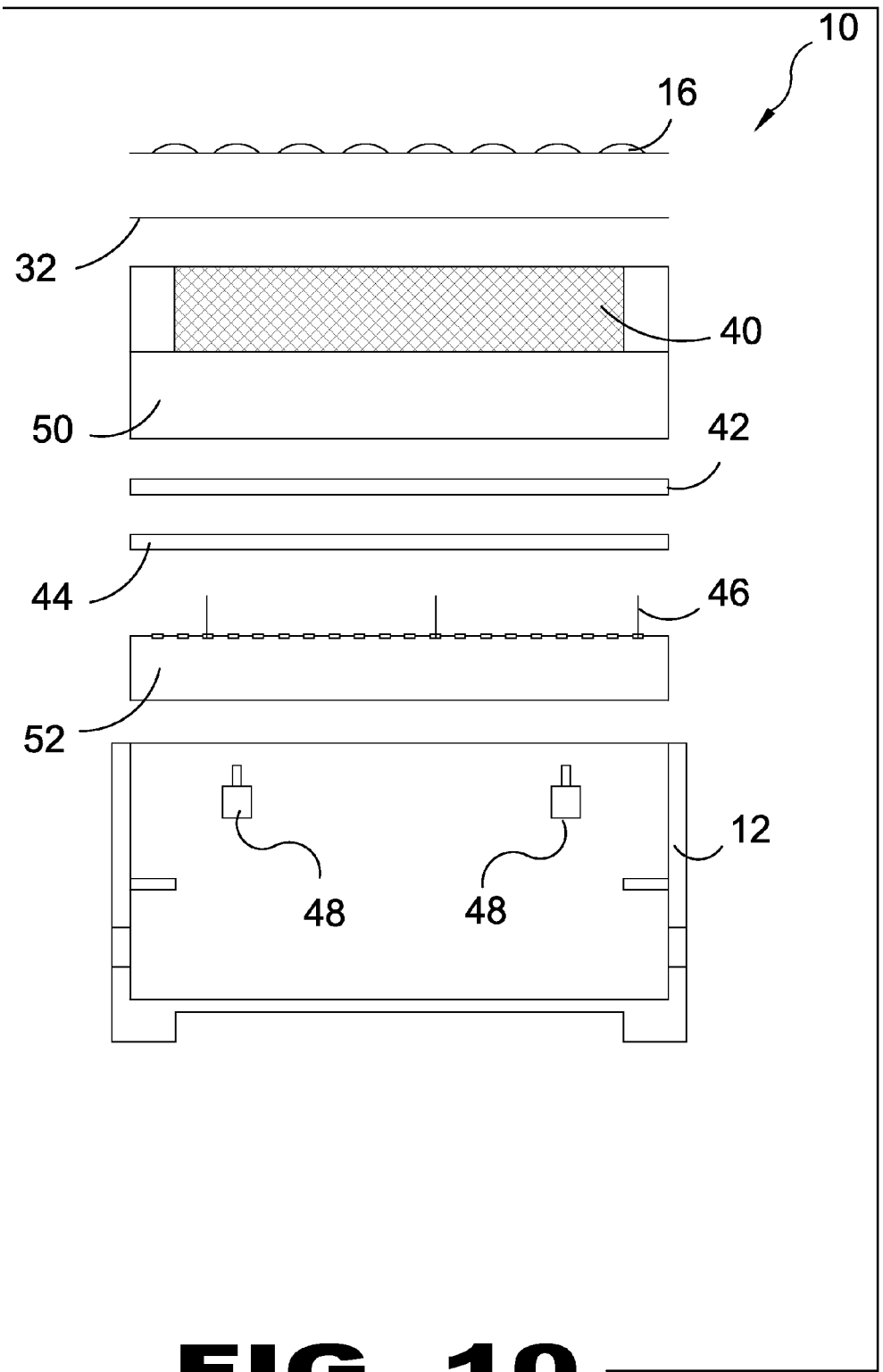
Figure 11:
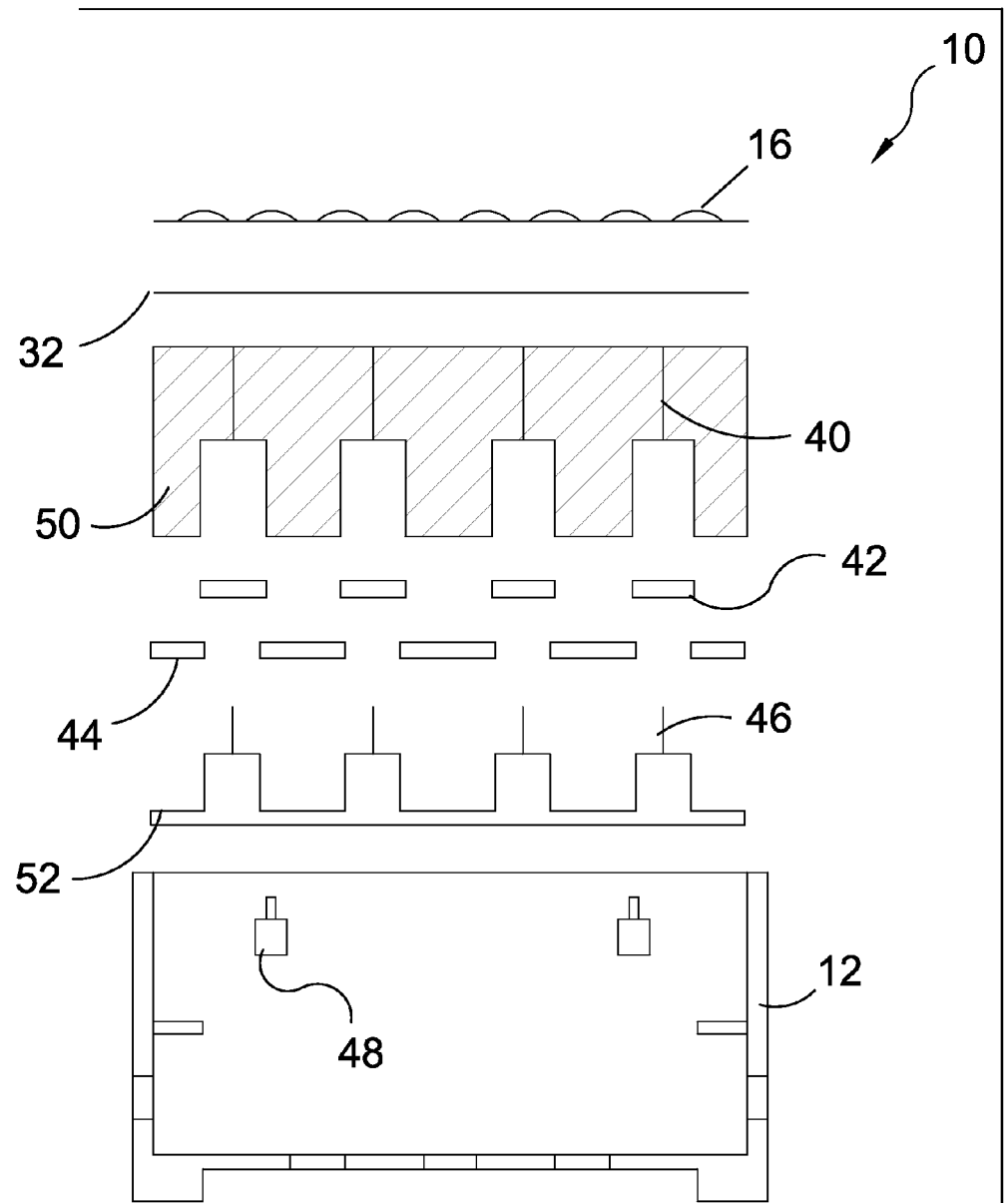

In order that the invention may be more fully understood, it will now be described, by way of example, with reference to the accompanying drawing in which:

FIG. 1 is an illustrative view of the present invention in use.
FIG. 2 is an illustrative view of the present invention in use.
FIG. 3 is a side view of the fresnel lens of the present invention.
FIG. 4 is a perspective exploded view of the present invention.
FIG. 5 is a diagram view of the present invention.
FIG. 6 is a perspective view of the housing of the present invention.
FIG. 7 is a perspective view of the present invention.
FIG. 8 is a perspective view of the present invention.
FIG. 9 is a perspective view of the present invention.
FIG. 10 is a side sectional view of the present invention.
FIG. 11 is a side sectional view of the present invention.

DETAILED DESCRIPTION OF THE PREFERRED EMBODIMENT

The following discussion describes in detail one embodiment of the invention (and several variations of that embodiment). This discussion should not be construed, however, as limiting the invention to those particular embodiments, practitioners skilled in the art will recognize numerous other embodiments as well. For definition of the complete scope of the invention, the reader is directed to appended claims.

FIG. 1 is an illustrative view of the present invention 10 in use. Shown is the present invention 10 being a device for producing energy and power utilizing incoming solar radiation 22 to invoke a thermal differential inside a housing 12 to produce an electric current utilizing a phenomenon more commonly known as the seebek effect. The Seebeck effect produces energy in the present invention by heating the junction between two dissimilar metals to create an electric current stemming from both their other ends. The housing 12 includes a top thermal collector 14 with a plurality of Fresnel lenses 16 and side plates 18 with a plurality of side vents 20.

FIG. 2 is an illustrative view of the present invention 10 in use. The present invention utilizes a phenomenon more commonly known as the seebek effect. The seebek effect produces energy in the present invention by exposing heat 22 the junction between two dissimilar metals to create an electric current 24 stemming from both ends of the first metal element 26 and the second metal element 28.

FIG. 3 is a side view of the fresnel lens 16 of the present invention 10. In order to focus incoming light more efficiently into a collecting plate 32, and form an arrangement capable of producing very high heats the present invention employs fresnel lenses 16 with associated plano convex lenses 30 capable of focusing photonic radiation 34 into a predetermined focal length 36 to direct condensed high energy and heat target area on a collector plate 32.

FIG. 4 is a perspective exploded view of the present invention 10 with the hot box 13 removed from the housing 12. Shown are the internal components comprising the present invention 10. Depicted is the housing 12 with a plurality of fresnel lenses 16 that focus light into thermal heat focused upon a metallic collecting plate 32 that is elevated above a lower plate 38 by a plurality of spaced apart mesh sheets 40 and movable isolation strips 42 forming thermal mass cavities 50. The lower plate 38 is in communication with the carrying board 52 with fixed strips 44 and affiliated carrying rods 46 and the carrying board 52 has a plurality of linear actuators 48 dispose on the bottom portion thereof.

FIG. 5 is a diagram view of the present invention 10. Shown is the present invention being utilized with a standard photovoltaic panel 54. During daylight hours the thermal collector 14 charges and the photovoltaic panels 54 produce power, at night the thermal unit takes over. During the operation of both units a microprocessor 56 distributes the produced power to be used or stored in a dry cell 58 for later use.

FIG. 6 is a perspective view of the housing 10 of the present invention 10. Shown is the housing 10 broken down into its core components a base plate 60 having a plurality of ventilation gaps 62 and a plurality of side plates 18 with each having an interiorly disposed hot box carrying edge 64.

FIG. 7 is a perspective view of the present invention 10. Shown is the carrying board 52, movable isolation strips 42 and carrying rods 46 of the present invention that are utilized in conjunction to both act as insulating elements and as a heat sink.

FIG. 8 is a perspective view of the present invention 10. Shown is relationship between the carrying board 52, movable isolation strips 42 and carrying rods 46 of the present invention, in the process of being joined with the lower plate 38, fixed isolation strips 44 and wire mesh sheets 40 to form an efficient thermal storage body.

FIG. 9 is a perspective view of the present invention 10. Shown are the carrying board 52, movable isolation strips 42 and carrying rods 46 of the present invention, joined with the lower plate 38, fixed isolation strips 44 and wire mesh 40 to form an efficient thermal storage body.

FIG. 10 is a side sectional view of the present invention 10. Shown is the present invention shown in a side sectional view that has been exploded. Depicted are all of the internal components and their relation to one another inside the housing of the present invention. Shown are the housing 12, linear actuators 48, carrying board 52, carrying rods 46, fixed isolation strips 44, movable isolation strips 42, thermal mass cavity 50, mesh sheet 40, collecting plate 32 and Fresnel lenses 16.

FIG. 11 is a side sectional view of the present invention 10. Shown is the present invention shown in a side sectional view that has been exploded. Depicted are all of the internal components and their relation to one another inside the housing of the present invention. Shown are the housing 12, linear actuators 48, carrying board 52, carrying rods 46, fixed isolation strips 44, movable isolation strips 42, thermal mass cavity 50, mesh sheet 40, collecting plate 32 and Fresnel lenses 16.

It will be understood that each of the elements described above, or two or more together may also find a useful application in other types of methods differing from the type described above.

While certain novel features of this invention have been shown and described and are pointed out in the annexed claims, it is not intended to be limited to the details above, since it will be understood that various omissions, modifications, substitutions and changes in the forms and details of the device illustrated and in its operation can be made by those skilled in the art without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

The invention claimed is:

1. A hybrid electric generator for producing energy and power utilizing incoming infrared radiation to invoke a thermal differential to produce an electric current, the hybrid electric generator comprising:
a housing having a top plate with a plurality of lenses for focusing energy on a collector plate, a lower plate having a plurality of ridges, said collector plate being mounted to said lower plate via a plurality of spaced apart mesh sheets, where each of said plurality of mesh sheets contacts a respective one of said plurality of ridges, each of said plurality of ridges being hollow and having a moveable isolation strip disposed therein, a carrying board below said lower plate, the carrying board having a plurality of projections, each projection having vertical sides joined by a top surface, each of said projections being received by a respective one of said plurality of ridges, each projection having carrying rods extending through the top surface thereof, a plurality of linear actuators controlling the carrying rods to effect movement of the ridges with respect to the projections, and a plurality of thermo-electric couples disposed in said carrying board where the thermo-electric couples formed of crisscrossed dissimilar metals forming bimetallic or semiconductor junctions to produce the Seebeck effect to convert the radiant energy to electrical energy.

2. The hybrid electric generator according to claim 1, wherein areas between said mesh screens define thermal mass cavities.

3. The hybrid electric generator according to claim 1, the housing having a base plate and four side walls with each having a plurality of vented slots.

4. The hybrid electric generator according to claim 3, wherein said carrying board rests on carrying edges interiorly disposed on said side walls of said housing.

5. The hybrid electric generator according to claim 1, further including an external microprocessing unit to regulate distribution of generated power.

6. The hybrid electric generator according to claim 5, including a dry cell battery to store energy that is unused for later use.

7. The hybrid electric generator according to claim 1, wherein a lower surface of the carrying board is insulated.

8. The hybrid electric generator according to claim 2, wherein said thermal mass cavities have a thermal mass disposed therein and said ridges of said lower plate conduct heat energy from the thermo mass and radiate it to said thermoelectric couples in said carrying board.

9. The hybrid electric generator according to claim 8, wherein when the hybrid electric generator is generating power, the projections of said carrying board slide inside and are engulfed by the ridges of said lower plate.

10. The hybrid electric generator according to claim 1, wherein the thermal mass absorbs the heat from said collector plate and mesh sheets to store it to be used later.

11. The hybrid electric generator according to claim 7, wherein said thermo-electric couples in said carrying board have their junctions disposed at the peaks of the projections.

12. The hybrid electric generator according to claim 11, wherein a bottom end of said thermo-electric couples extend beyond the lower face of said carrying board passing through said insulation.

13. The hybrid electric generator according to claim 12, wherein said bottom ends of said thermo-electric couples are connected together in series.

14. The hybrid electric generator according to claim 5, wherein said linear actuators are controlled by said micro processing unit.

15. The hybrid electric generator according to claim 1, where the plurality of lenses are Fresnel lenses.

* * * * *